(12) United States Patent
Kang et al.

(10) Patent No.: US 7,563,425 B2
(45) Date of Patent: Jul. 21, 2009

(54) CARBONNITRIDE NANOTUBES WITH NANO-SIZED PORES ON THEIR STEMS, THEIR PREPARATION METHOD AND CONTROL METHOD OF SIZE AND QUANTITY OF PORE THEREOF

(75) Inventors: Jeung-Ku Kang, Daejeon (KR); Jai-Young Lee, Daejeon (KR); Hyun-Seok Kim, Daejeon (KR); Seong-Ho Yang, Daejeon (KR); Kyu-Sung Han, Daejeon (KR); Se-Yun Kim, Daejeon (KR); Jung-Woo Lee, Daejeon (KR); Weon-Ho Sin, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 11/819,700

(22) Filed: Jun. 28, 2007

(65) Prior Publication Data
US 2009/0004091 A1    Jan. 1, 2009

(51) Int. Cl.
*C01C 3/00* (2006.01)
*C01B 31/30* (2006.01)
(52) U.S. Cl. .................. 423/384; 423/439; 977/734
(58) Field of Classification Search .......... 423/384, 423/439; 977/734, 843
See application file for complete search history.

(56) References Cited

OTHER PUBLICATIONS

Han, S.S., et al., "Nanopores of carbon nanotubes as practical hydrogen storage media", *Applied Physics Letters*, vol. 87, No. 231113, pp. 1-3, (2005).
Ma, X., et al., "Polymerized carbon nanobells and their field-emission properties", *Applied Physics Letters*, vol. 75, No. 20, pp. 3105-3107, (1999).
Zhang, G.Y., et al., "Polymerized carbon nitride nanobells", *Journal of Applied Physics*, vol. 91, No. 11, pp. 9324-9332, (2002).

*Primary Examiner*—Wayne Langel
*Assistant Examiner*—Brittany M Martinez
(74) *Attorney, Agent, or Firm*—The Nath Law Group; Joshua B. Goldberg; Ari G. Zytcer

(57) ABSTRACT

Disclosed are carbon nitride ($C_{1-x}N_x$) nanotubes with nano-sized pores on their stems, their preparation method and control method of size and quantity of pores thereof.

The present invention further has an object of providing the $C_{1-x}N_x$ nanotube with pores having the size of not more than 1 nm over structure of the nanotube and a method for preparing the same.

Another object of the present invention is to provide the control method of the size and quantity of pores with size of not more than 1 nm in the preparation of the $C_{1-x}N_x$ nanotube with the pores over structure of the nanotube.

The present invention can produce the $C_{1-x}N_x$ nanotube with nano-sized pores by reacting hydrocarbon gas and nitrogen gas through plasma CVD in the presence of metal catalyst particles, wherein x ranges from 0.001 to 0.2.

4 Claims, 6 Drawing Sheets

CARBONNITRIDE NANOTUBES WITH NANO-SIZED PORES ON THEIR STEMS, THEIR PREPARATION METHOD AND CONTROL METHOD OF SIZE AND QUANTITY OF PORE THEREOF

BACKGROUND OF THE INVENTION

The present invention relates to carbon nitride ($C_{1-x}N_x$) nanotubes with nano-sized pores on their stems, their preparation method and control method of the size and the quantity of pore thereof.

A nanotube means the material of a tube or a cylindrical form with its diameter of several to several tens of nanometers.

The carbon nanotube is well known as an example of the nanotube described above.

The carbon nanotube was discovered when a carbon deposit formed at negative electrode of graphite by arc-discharge was analyzed by Dr. Iijima Sumio, Research Institute of NEC, 1991.

Such a carbon nanotube is in the tubular form in which six (6) carbon atoms form a hexagonal molecule and a plurality of these hexagonal molecules are bonded together to complete the tubular form. This tubular material was called as a 'carbon nanotube' because its diameter is only in the range of several to several tens of nanometers.

Various physical and chemical properties of this material, that is, the carbon nanotube have been demonstrated ever since the carbon nanotube was ascertained.

As representative properties of the carbon nanotube, electrical conductivity of the carbon nanotube is similar to that of Cu metal, its thermal conductivity is substantially equal to that of diamond and its strength is much superior, at least 100 times, to that of iron steel. The carbon nanotube can bear at best 15% of deformation thereof, whereas general carbon fibers are broken off even if only 1% of deformation is applied thereto.

Scientists have performed extensive research and investigation for synthesis and applications of the carbon nanotube after this material was disclosed. For example, it continues at present to develop many apparatuses using the carbon nanotubes such as, for example, semiconductors and flat display panels, batteries, super-intensity fibers, biometrical sensors, TV cathode ray tubes and so on. In addition, the nanotube is also used in fabrication of nano-sized tongs to pick up and move nano-sized materials.

The present invention provides the $C_{1-x}N_x$ nanotube with nano-sized pores, which comprises carbon and nitrogen ingredients as major ingredients, and production method thereof.

Especially, the present invention can provide the $C_{1-x}N_x$ nanotube with the controlled size and quantity of nano-sized pores by adding impurities during preparation thereof.

The $C_{1-x}N_x$ nanotube with desirable nano-sized pores over structure of the nanotube according to the present invention exhibited a more uniform and finer dispersion of metal ingredients than that of general carbon nanotubes in the same condition for the dispersion. Since the nano-sized pores over the structure of the nanotube induce the gas adsorption energy to be increased, the nanotube is also preferably used as a gas detection sensor material. Refer for example to Han et al., Appl. Phys. Lett. 87 (2005) 213113.

Conventional technologies in relation to the present invention have proposed the $C_{1-x}N_x$ nanotube with structure similar to that of the present invention. Refer for example to X. Ma, Appl. Phys. Lett 75(20), (1999), 3105 and G. Y. Zhang, Journal of Applied Physics, 91(11), (2002), 9324.

However, it is not certain in the art whether the nanotube proposed by X. Ma or G. Y. Zhang has nano-sized pores like as the $C_{1-x}N_x$ nanotube of the present invention. Also, the control method of the size and quantity of nano-sized pores as described in present invention is still unknown.

SUMMARY OF THE INVENTION

The present inventors found that the $C_{1-x}N_x$ nanotube prepared through plasma enhanced CVD has nano-sized pores of not more than 1 nm over the structure of the nanotube and achieved a technical breakthrough to control the size and quantity of such nano-sized pores.

Accordingly, an object of the present invention is to provide the $C_{1-x}N_x$ nanotube with nano-sized pores of not more than 1 nm over structure thereof.

It is another object of the present invention to provide a method for producing the $C_{1-x}N_x$ nanotube with nano-sized pores of not more than 1 nm over structure thereof.

It is still another object of the present invention to provide a control method of the size and quantity of nano-sized pores of not more than 1 nm in $C_{1-x}N_x$ nanotube during preparation thereof.

In order to accomplish the above objects, the present invention provides the $C_{1-x}N_x$ nanotube with nano-sized pores by reacting hydrocarbon gas and nitrogen gas through plasma CVD in the presence of metal catalyst particles, wherein x in the $C_{1-x}N_x$ nanotube ranges from 0.001 to 0.2.

Such metal catalyst functions as a catalyst during formation of a $C_{1-x}N_x$ nanotube and conducts a catalytic reaction to promote the growth of hydrocarbon gas and nitrogen gas and form a $C_{1-x}N_x$ nanotube.

The metal catalyst is not particularly limited but includes any metal ingredients so far as they conduct the catalytic reaction during formation of the $C_{1-x}N_x$ nanotube.

Illustrative examples of the metal catalyst comprise any one selected from a group consisting of Co, Fe, Ni and metal compounds thereof.

The metal catalyst can be directly prepared using the sputtering or E-beam evaporation methods using the metal targets commercially available in the market.

The metal catalyst may be also used to fabricate metal catalyst particles by depositing the metal catalyst on a substrate to form a metal layer and then by plasma treatment of the metal layer.

Such a substrate comprises any one selected from a group consisting of a silicon (Si) substrate, a $SiO_2$/Si substrate where silicon dioxide film is deposited above silicon film, a alumina substrate and a glass substrate.

The thickness of the metal layer deposited on the substrate can be adjusted by controlling the deposition method based on size of the metal catalyst particles.

Illustrative examples of the metal layer deposition include the magnetron RF sputtering and the plasma CVD method in order to deposit the metal layer on the substrate at the thickness of 5 to 10 nm. Herein, the plasma CVD method adopts a microwave, RF or DC power source for the plasma source.

In case of using the magnetron RF sputtering method, nitrogen plasma is applied to the metal layer after deposition of the metal layer on the substrate at a desired thickness in order to form the metal layer consisting of metal catalyst particles. Such a nitrogen plasma application is typically carried out with output power of 200 to 1,500 W for 10 seconds to 10 minutes.

Alternatively, the present invention can grow the nanotube by reacting hydrocarbon gas with nitrogen gas through plasma CVD in the presence of metal catalyst.

Hydrocarbon gas and nitrogen gas described above react together in relative ratios of 10 to 90% of hydrocarbon gas and 10 to 90% of nitrogen gas, respectively, in the presence of metal catalyst.

In such a case, hydrocarbon gas and nitrogen gas are separately added to the metal catalyst in order to maintain contents of both of the gases in a mixture thereof in relative ratios of 10 to 90% of hydrocarbon gas and 10 to 90% of nitrogen gas during the reaction in the presence of the metal catalyst.

Also, the $C_{1-x}N_x$ nanotube with nano-sized pores can be grown by reacting hydrocarbon gas with nitrogen gas through plasma CVD in the presence of metal catalyst particles.

The method for producing the $C_{1-x}N_x$ nanotube with nano-sized pores is exemplified with a process comprising: a step of introducing 10 to 90 sccm of hydrocarbon gas and 10 to 90 sccm of nitrogen gas to metal catalyst particles formed on a substrate; and a step of growing the nanotube having pores with the diameter of 5 to 10 Å through plasma CVD with 50 to 1,500 W at 350 to 1,100° C. under the pressure of 5 to 30 torr for 1 to 60 minutes.

The present invention includes a gas detection sensor fabricated by adopting the $C_{1-x}N_x$ nanotube with nano-sized pores produced as described above.

The present invention further includes a nano-sized filter fabricated by adopting the $C_{1-x}N_x$ nanotube with nano-sized pores produced as described above.

The present invention further includes a hydrogen storage medium prepared by using $C_{1-x}N_x$ nanotube with nano-sized pores produced as described above.

The present invention further includes a catalyst carrier for fuel cell fabricated by adopting the $C_{1-x}N_x$ nanotube with nano-sized pores produced as described above.

The present invention provides a method for controlling size and quantity of pores in the $C_{1-x}N_x$ nanotube by reacting hydrocarbon gas, nitrogen gas and oxygen gas together through plasma CVD in the presence of metal catalyst, wherein x in $C_{1-x}N_x$ ranges from 0.001 to 0.2.

The reactive gases are introduced in the presence of a metal catalyst to become a mixture containing all of the gases in the relative ratios of 9 to 89% of hydrocarbon gas, 10 to 90% of nitrogen gas and 1 to 50% of oxygen gas. By reacting all of the gases together through plasma CVD, a $C_{1-x}N_x$ nanotube can be produced with the controlled size and quantity of pores in the nanotube. Herein, the pores are formed to have the diameter ranging from 5 to 10 Å

The present invention can control size and quantity of pores in the $C_{1-x}N_x$ nanotube produced by reacting 9 to 89% of hydrocarbon gas, 10 to 90% of nitrogen gas and 1 to 50% of oxygen gas together as the reactive gases through plasma CVD in the presence of metal catalyst. The control method is carried out under the desired conditions of the reaction including, for example, the output power of 50 to 1,500 W, the temperature of 350 to 1100° C., the pressure of 5 to 30 torr, and the reaction time of 1 to 60 minutes.

Hydrocarbon gas as one of the reactive gases used in production of the $C_{1-x}N_x$ nanotube with the controlled size and quantity of pores according to the present invention may comprise hydrocarbon gas having carbon atoms, the number of which ranges from 1 to 10.

Illustrative examples of the hydrocarbon gas include any one selected from a group consisting of methane, ethane, propane, butane, ethylene and acetylene.

Oxygen gas functions to decrease concentration of nitrogen gas and controls the size and the quantity of pores in a $C_{1-x}N_x$ nanotube. Hydrogen gas may substitute for oxygen gas to control the size and quantity of pores in $C_{1-x}N_x$ nanotube.

Furthermore, the present invention includes a gas detection sensor fabricated by adopting the $C_{1-x}N_x$ nanotube with the controlled size and quantity of pores produced as described above.

The present invention further includes a nano-sized filter fabricated by adopting the $C_{1-x}N_x$ nanotube with the controlled size and quantity of pores produced as described above.

The present invention further includes a hydrogen storage medium prepared by using the $C_{1-x}N_x$ nanotube with controlled size and quantity of pores produced as described above.

The present invention further includes a catalyst carrier for fuel cell fabricated by adopting the $C_{1-x}N_x$ nanotube with controlled size and quantity of pores produced as described above.

The present invention further includes the $C_{1-x}N_x$ nanotube with nano-sized pores wherein x ranges from 0.001 to 0.2.

The $C_{1-x}N_x$ nanotube with nano-sized pores according to the present invention has the diameter of the pores ranging from 5 to 10 Å.

BRIEF DESCRIPTION OF THE DRAWINGS

The above objects, features and advantages of the present invention will become more apparent to those skilled in the related art in conjunction with the accompanying drawings.

DETAILED DESCRIPTION OF THE INVENTION

Hereinafter, the present invention will become apparent from the following examples and experimental examples with reference to the accompanying drawings. However, these are intended to illustrate the invention as preferred embodiments of the present invention and do not limit the scope of the present invention.

EXAMPLE 1

A catalyst for accelerating growth of $C_{1-x}N_x$ nanotube was prepared by means of magnetron RF sputtering method.

In the above preparation method, $SiO_2$/Si substrate was employed and cobalt (Co) was deposited on the substrate under the desired reaction conditions including, for example, the CVD temperature of 200° C. and the pressure of 15 torr under Ar atmosphere. For a CVD process, the RF output power was 100 W and the thickness of the Co layer deposited on the substrate was 7 nm.

The Co layer underwent plasma treatment with a microwave power of 750 W in a microwave enhanced CVD apparatus for 1 minute in order to produce catalyst particles.

After formation of Co particles on the substrate, the substrate containing Co particles was placed in a chamber, 15% of methane ($CH_4$) and 85% of nitrogen ($N_2$) were separately introduced into the chamber and the mixture in the chamber was subjected to plasma reaction, thereby producing $C_{1-x}N_x$ nanotube wherein x ranges from 0.001 to 0.2.

In such case, the chamber was maintained with internal temperature of 850° C. and pressure of 21 torr. The microwave power was 800 W during plasma reaction for 20 minutes.

EXAMPLE 2

A catalyst for accelerating the growth of a $C_{1-x}N_x$ nanotube was prepared by means of a magnetron RF sputtering method.

In the above preparation method, a $SiO_2$/Si substrate was employed and Co was deposited on the substrate under the desired reaction conditions including, for example, the CVD temperature of 200° C. and the pressure of 15 torr under Ar atmosphere. For a CVD process, RF output power was 100 W and thickness of the Co layer deposited on the substrate was 7 nm.

The Co layer underwent plasma treatment with the microwave power of 750 W in a microwave enhanced CVD apparatus for 1 minute in order to produce catalyst particles.

After formation of Co particles on the substrate, the substrate containing Co particles was placed in a chamber, 15% of methane ($CH_4$), 81% of nitrogen ($N_2$) and 4% of oxygen ($O_2$) were separately introduced into the chamber and the mixture in the chamber was subjected to plasma reaction, thereby producing the $C_{1-x}N_x$ nanotube with the controlled size and quantity of pores therein wherein x ranges from 0.001 to 0.2.

In such case, the chamber was maintained with the internal temperature of 850° C. and the pressure of 21 torr. The microwave power was 800 W during the plasma reaction for 20 minutes.

EXPERIMENTAL EXAMPLE 1

Figure 1:
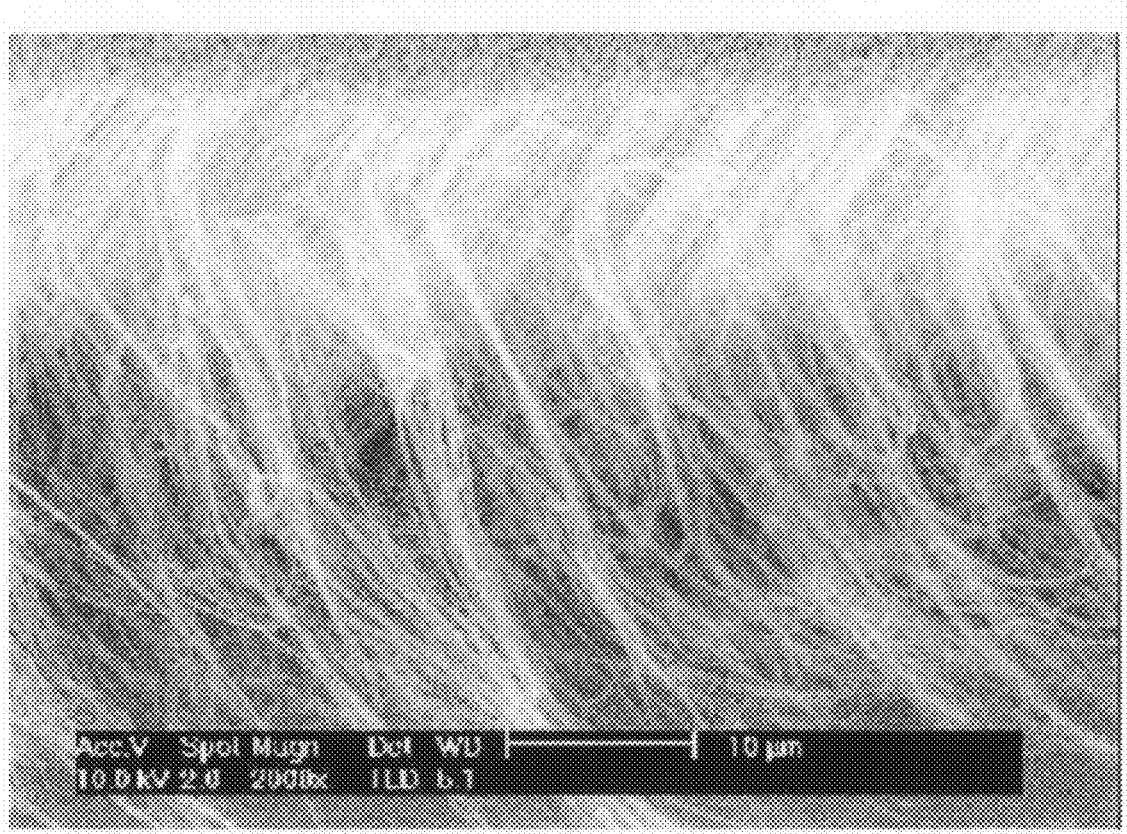
FIG. 1 is a SEM photograph illustrating the $C_{1-x}N_x$ nanotube with pores having the diameter of about 6 Å.

By the method described in Example 1, produced were $C_{1-x}N_x$ nanotubes with pores having the diameter of 6 Å wherein x in the $C_{1-x}N_x$ nanotube ranges from 0.001 to 0.2. FIG. 1 illustrates a photograph of the produced $C_{1-x}N_x$ nanotubes.

From FIG. 1, it was identified that the nanotubes were vertically oriented and well grown.

EXPERIMENTAL EXAMPLE 2

Ethanol solution containing 4 mM Ni acetate was dispersed on the surface of a typically known carbon nanotube and the surface of the $C_{1-x}N_x$ nanotube with the pore size of 6 Å (wherein x ranges from 0.001 to 0.2) produced in Example 1. Both of the treated nanotubes are illustrated in transmission electron microscopes (TEM) of FIG. 2 and FIG. 3, respectively.

Figure 2:
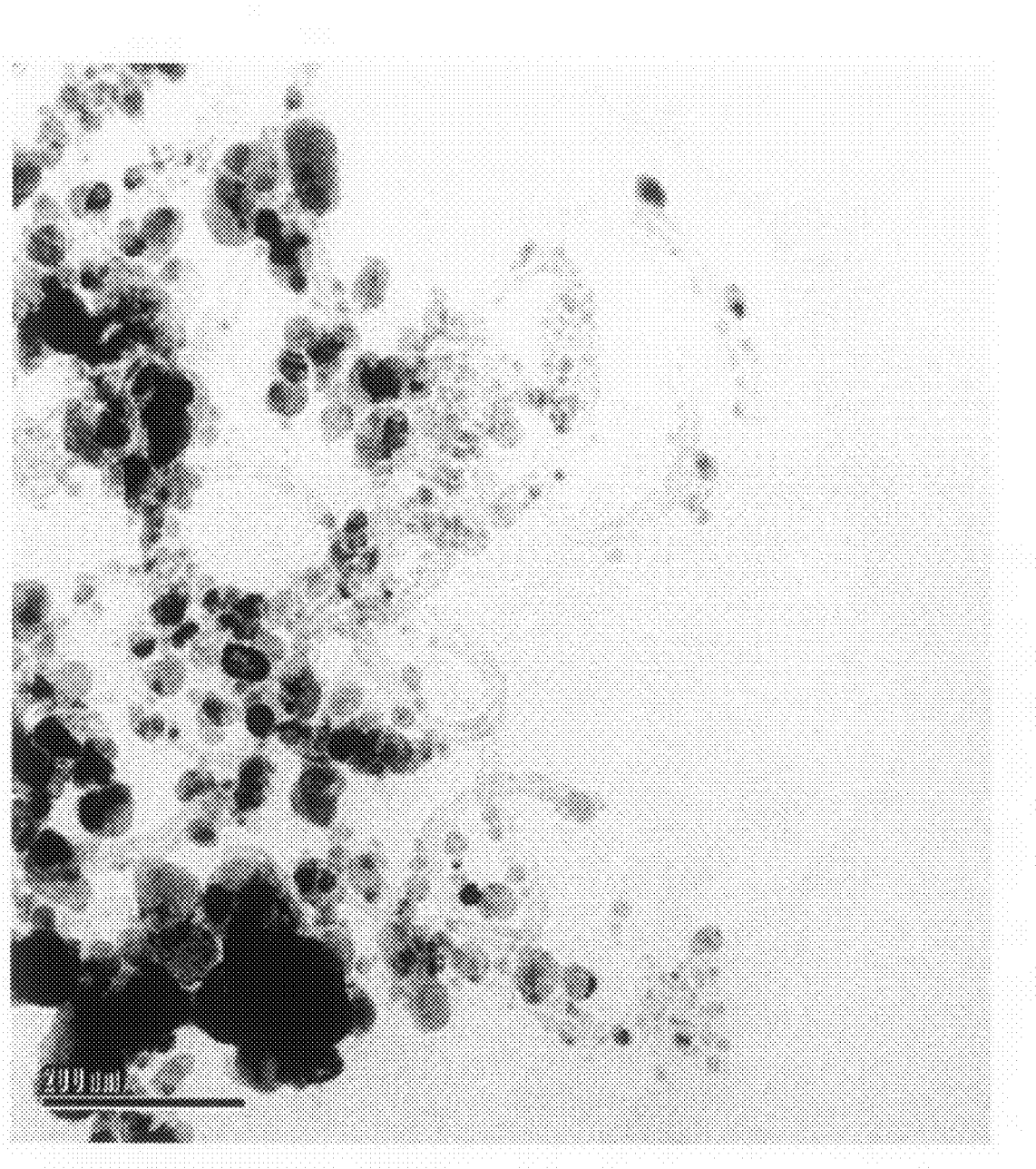
FIG. 2 is a transmission electron microscope (TEM) illustrating general carbon nanotube after dispersing Ni over surface thereof by using 4 mM Ni acetate in ethanol solution.
Figure 3:
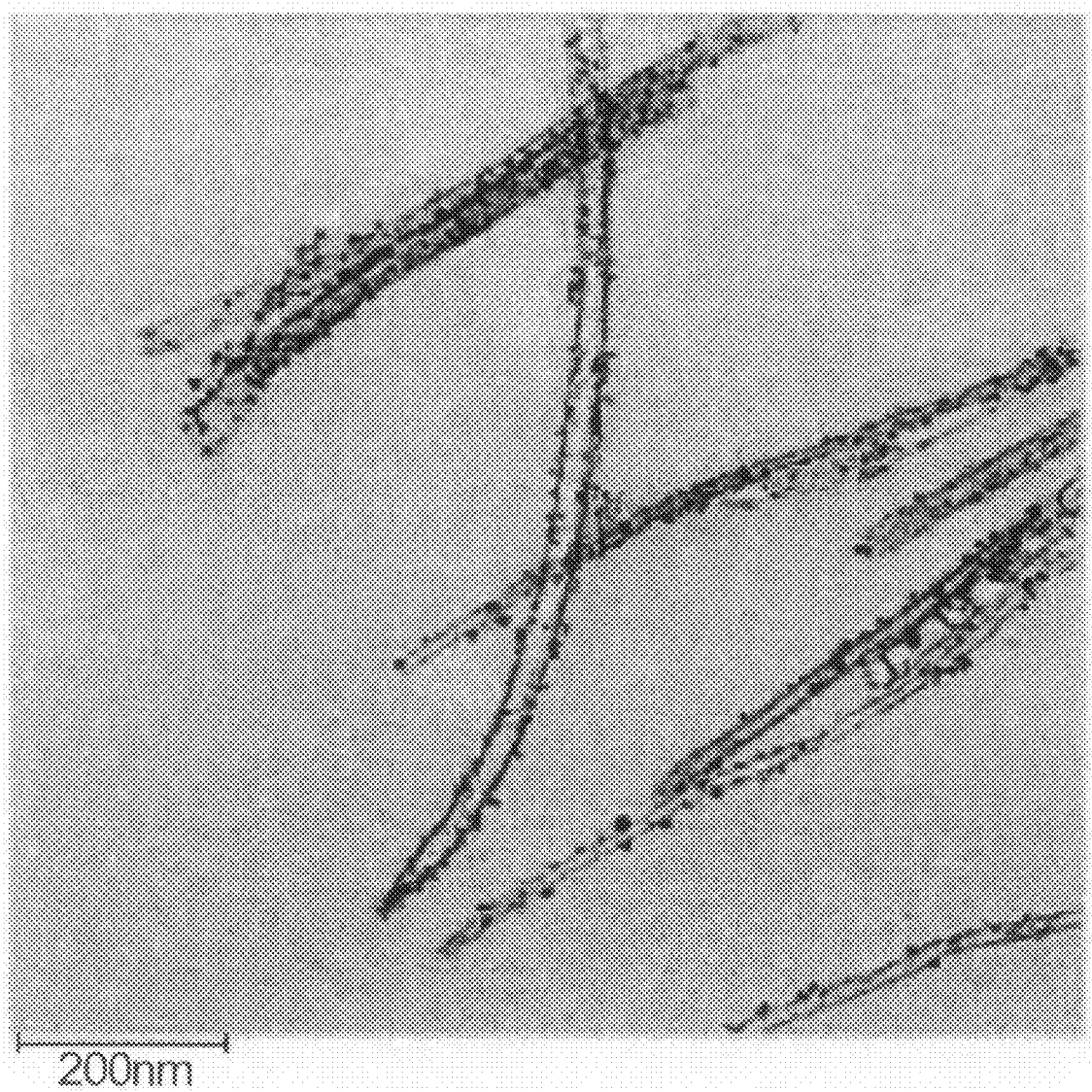
FIG. 3 is a TEM illustrating the $C_{1-x}N_x$ nanotube of the present invention after dispersing Ni over surface thereof by using 4 mM Ni acetate in ethanol solution.

From FIGS. 2 and 3, it was demonstrated that the $C_{1-x}N_x$ nanotube (wherein x ranges from 0.001 to 0.2) shown in FIG. 3 had a more uniform Ni dispersion and smaller size of Ni dispersion than that of the known carbon nanotube shown in FIG. 2, although both of the nanotubes were under the same condition of Ni dispersion.

EXPERIMENTAL EXAMPLE 3

In order to identify whether the $C_{1-x}N_x$ nanotube (wherein x ranges from 0.001 to 0.2) produced according to the present invention has the pore diameter of not more than 1 nm and the size of the pores is varied, the BJH pore size distribution was measured. The BJH pore size distribution was analyzed using Autosorb-3B apparatus with $N_2$ as the absorption gas.

Figure 4:
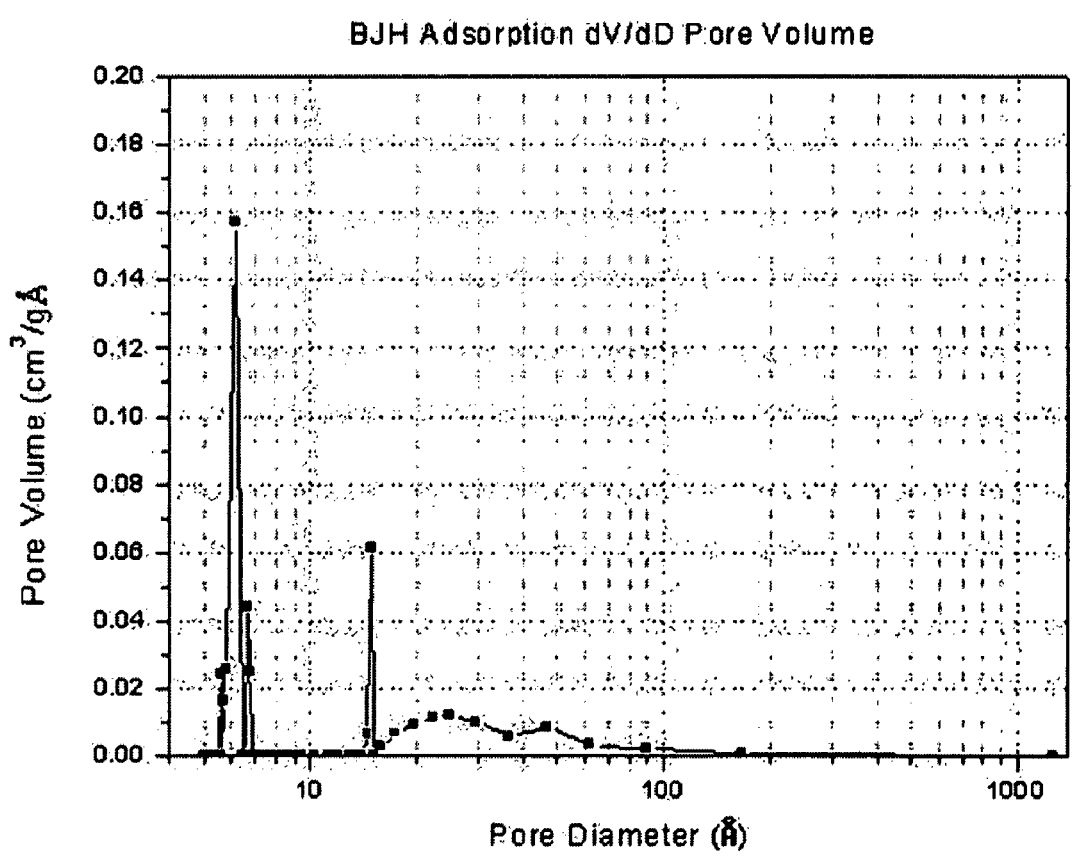
FIG. 4 shows a graph plotting a BJH adsorption pore volume of the $C_{1-x}N_x$ nanotube produced by the present invention.

FIG. 4 illustrates a graph plotting a BJH adsorption pore volume of the $C_{1-x}N_x$ nanotube (wherein x ranges from 0.001 to 0.2) produced in Example 1 according to the present invention. In FIG. 4, a big peak was monitored at the pore size of 6 Å.

EXPERIMENTAL EXAMPLE 4

In order to identify whether $C_{1-x}N_x$ nanotube (wherein x ranges from 0.001 to 0.2) produced according to the present invention has the pore diameter of not more than 1 nm and the size of the pores is varied, The BJH pore size distribution was measured. The BJH pore size distribution was analyzed using Autosorb-3B apparatus with $N_2$ as the absorption gas.

Figure 5:
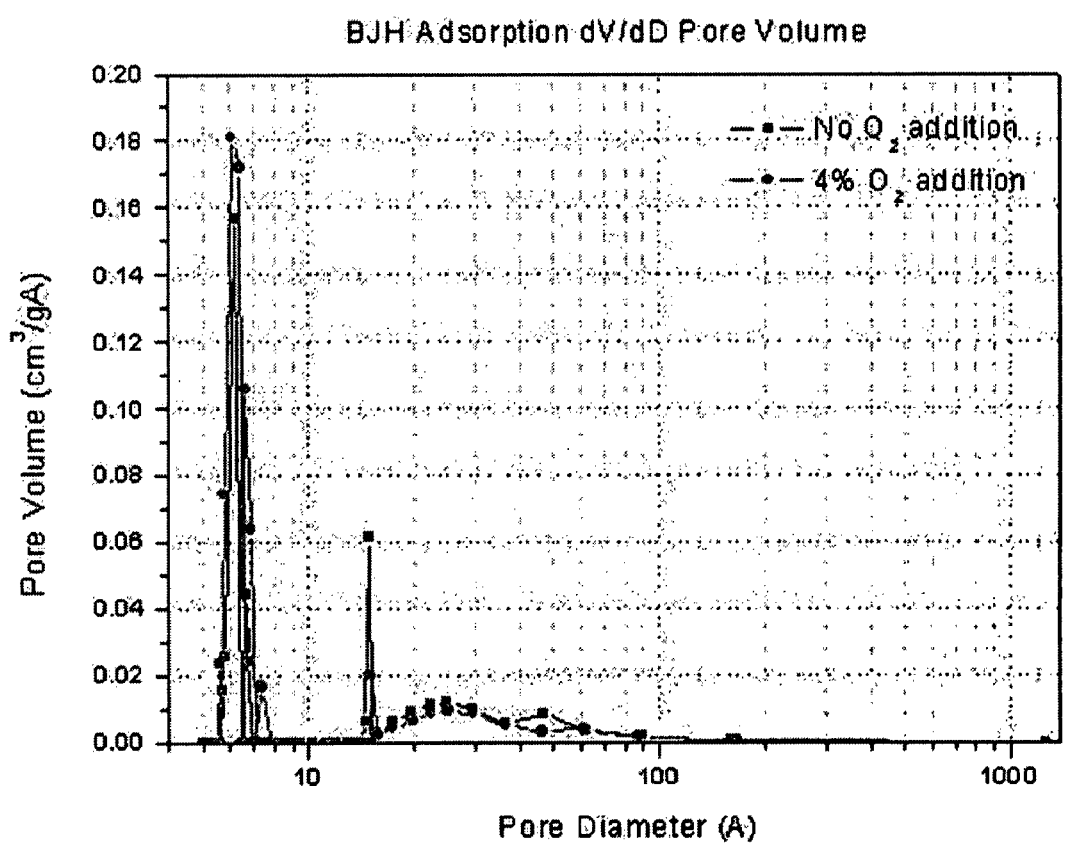
FIG. 5 shows graphs plotting a BJH adsorption pore volume of a sample prepared by adding 4% $O_2$ while growing nanotube in order to control the quantity of nano-sized pores of the nanotube, compared to the sample before addition of $O_2$.

FIG. 5 illustrates graphs plotting a BJH adsorption pore volume of a sample (Example 2) of the $C_{1-x}N_x$ nanotube (wherein x ranges from 0.001 to 0.2) prepared by adding 4% $O_2$ while growing the nanotube in order to control the quantity of nano-sized pores of the nanotube, compared to the sample before addition of $O_2$ (Example 1).

Figure 6:
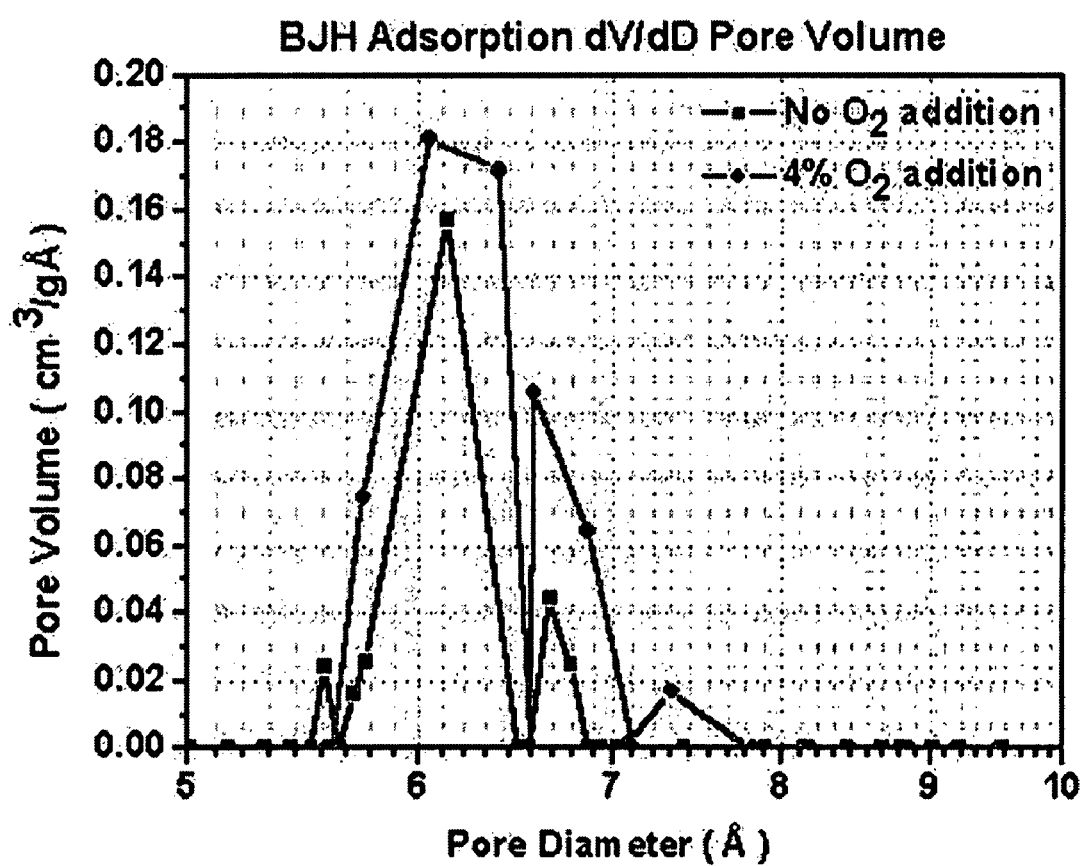
FIG. 6 shows graphs linearly plotting a BJH adsorption pore volume of both of $C_{1-x}N_x$ nanotubes produced with and without addition of $O_2$ in the range of 5 to 10 Å.

FIG. 6 illustrates graphs linearly plotting BJH adsorption pore volume of both of $C_{1-x}N_x$ nanotubes (wherein x ranges from 0.001 to 0.2) produced with and without addition of $O_2$ (Example 2 and Example 1). From FIG. 6, it was found in the range of 5 to 10 Å that $C_{1-x}N_x$ nanotube (wherein x ranges from 0.001 to 0.2), which was grown with $O_2$ addition at 5.5 to 8 Å, had increase in the volume of the pores, compared to that of the $C_{1-x}N_x$ nanotube (wherein x ranges from 0.001 to 0.2) which was grown without $O_2$ addition. Also, it was found that pores having the diameter size of 7.5 Å were additionally formed in the nanotube.

Briefly, we found that, when the $C_{1-x}N_x$ nanotube is produced by the reacting hydrocarbon gas with nitrogen gas through the plasma CVD in the presence of catalyst metal, the size and quantity of pores formed in the $C_{1-x}N_x$ nanotube can be controlled by adding oxygen gas to the reactive gases.

As shown in results of the above examples and experimental examples, it can be clearly understood that the present invention can produce the $C_{1-x}N_x$ nanotube with desired nano-sized pores over the structure of the nanotube, which is characterized to have a more uniform and finer dispersion of metal components than that of general carbon nanotubes in the same condition for the dispersion.

The present invention can increase gas adsorption energy through nano-sized pores existing over the structure of $C_{1-x}N_x$ nanotube, and therefore, be employed in gas detection sensors, nano filters, catalyst carriers for fuel cell, hydrogen storage media and other various applications.

Additionally, the $C_{1-x}N_x$ nanotube with the controlled size and quantity of pores according to the present invention is applicable in gas detection sensors, nano filters, catalyst carriers for fuel cell, hydrogen storage media and other various applications.

Although the present invention was described in detail with reference to preferred embodiments of the invention as explained above, those skilled in the art will recognize that various other modifications and variations of the invention can be readily made without departing from the scope and spirit of the present invention as defined by the appended claims.

What is claimed is:

1. A method for producing a $C_{1-x}N_x$ nanotube with pores having nano-sized diameter comprising:

reacting 10 to 90% of hydrocarbon gas with 10 to 90% of nitrogen gas through a plasma CVD (chemical vapor deposition) in the presence of a metal catalyst to grow the nanotube, and controlling the pore diameter by controlling the concentration of nitrogen gas:

wherein x ranges from 0.001 to 0.2.

2. The method according to claim 1, wherein the metal catalyst comprises any one selected from a group consisting of cobalt (Co), nickel (Ni) and metal compounds thereof.

3. The method according to claim 1, wherein the hydrocarbon gas has carbon atoms, the number of which ranges from 1 to 10.

4. The method according to claim 1, wherein the pores have a diameter size ranging from 5 to 10 Å.

* * * * *

UNITED STATES PATENT AND TRADEMARK OFFICE
CERTIFICATE OF CORRECTION

PATENT NO. : 7,563,425 B2  
APPLICATION NO. : 11/819700  
DATED : July 21, 2009  
INVENTOR(S) : Jeung-Ku Kang et al.

Page 1 of 1

It is certified that error appears in the above-identified patent and that said Letters Patent is hereby corrected as shown below:

Claim 1, Column 8, Line 2  
Please delete  
    "gas:"  
and replace with  
    -- gas; --

Signed and Sealed this

Eighth Day of September, 2009

David J. Kappos  
*Director of the United States Patent and Trademark Office*